(12) United States Patent
Nickel et al.

(10) Patent No.: US 9,293,200 B2
(45) Date of Patent: Mar. 22, 2016

(54) MULTILAYER MEMORY ARRAY

(75) Inventors: Janice H. Nickel, Sunnyvale, CA (US); Gilberto Medeiros Ribeiro, Menlo Park, CA (US); Jianhua Yang, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 197 days.

(21) Appl. No.: 13/811,023

(22) PCT Filed: Aug. 30, 2010

(86) PCT No.: PCT/US2010/047115
§ 371 (c)(1),
(2), (4) Date: Jan. 18, 2013

(87) PCT Pub. No.: WO2012/030320
PCT Pub. Date: Mar. 8, 2012

(65) Prior Publication Data
US 2013/0114329 A1    May 9, 2013

(51) Int. Cl.
*G11C 5/06* (2006.01)
*H01L 27/24* (2006.01)
(Continued)

(52) U.S. Cl.
CPC ........ *G11C 13/0007* (2013.01); *G11C 13/0069* (2013.01); *H01L 27/101* (2013.01); *H01L 27/1021* (2013.01); *H01L 27/2409* (2013.01); *H01L 27/2481* (2013.01); *G11C 5/063* (2013.01); *G11C 13/0002* (2013.01); *G11C 13/004* (2013.01); *G11C 13/02* (2013.01);
(Continued)

(58) Field of Classification Search
CPC ..... H01L 27/10; H01L 27/11; H01L 45/1233; H01L 45/08; H01L 45/146; H01L 27/2463; H01L 45/145; H01L 27/24; H01L 27/2481; H01L 45/1253; G11C 13/0007; G11C 13/0002; G11C 13/004; G11C 13/0069; G11C 2213/77; G11C 5/063; G11C 13/02
USPC ............... 257/4, 5; 365/148, 63, 100, 129, 51
See application file for complete search history.

(56) References Cited

U.S. PATENT DOCUMENTS 3,827,033 A * 7/1974 Quilliam ....................... 365/163
6,490,192 B2  12/2002 Thewes et al.
(Continued)

FOREIGN PATENT DOCUMENTS

KR   10-2007-0062435   6/2007
KR   10-2010-0052080   5/2010
(Continued)

OTHER PUBLICATIONS

Chua et al., Circuit elements with memory: memristors, memcapacitors and meminductors, Jan. 23, 2009, Proceedings of the IEEE 97, 1717 (2009).*

(Continued)

*Primary Examiner* — Ly D Pham
(74) *Attorney, Agent, or Firm* — Fabian VanCott

(57) ABSTRACT

A multilayer crossbar memory array includes a number of layers. Each layer includes a top set of parallel lines, a bottom set of parallel lines intersecting the top set of parallel lines, and memory elements disposed at intersections between the top set of parallel lines and the bottom set of parallel lines. A top set of parallel lines from one of the layers is a bottom set of parallel lines for an adjacent one of the layers.

16 Claims, 6 Drawing Sheets

(51) Int. Cl.

| | | |
|---|---|---|
| *H01L 29/861* | (2006.01) | |
| *G11C 13/00* | (2006.01) | |
| *H01L 27/10* | (2006.01) | |
| *H01L 27/102* | (2006.01) | |
| *G11C 13/02* | (2006.01) | |
| *H01L 45/00* | (2006.01) | |

(52) U.S. Cl.
CPC .... *G11C2013/0073* (2013.01); *G11C 2213/71* (2013.01); *G11C 2213/77* (2013.01); *H01L 27/24* (2013.01); *H01L 27/2463* (2013.01); *H01L 45/08* (2013.01); *H01L 45/1233* (2013.01); *H01L 45/1253* (2013.01); *H01L 45/145* (2013.01); *H01L 45/146* (2013.01); *H01L 45/147* (2013.01)

(56) References Cited

U.S. PATENT DOCUMENTS

| | | | | |
|---|---|---|---|---|
| 7,057,914 | B2 * | 6/2006 | Rinerson et al. | 365/51 |
| 7,706,177 | B2 | 4/2010 | Petti | |
| 7,902,869 | B1 * | 3/2011 | Carter | 326/41 |
| 7,985,962 | B2 * | 7/2011 | Bratkovski et al. | 257/4 |
| 8,259,485 | B2 * | 9/2012 | Yang et al. | 365/148 |
| 8,565,003 | B2 * | 10/2013 | Siau | 365/148 |
| 2002/0048870 | A1 * | 4/2002 | Lane | 438/186 |
| 2005/0012119 | A1 | 1/2005 | Herner et al. | |
| 2006/0250836 | A1 | 11/2006 | Herner et al. | |
| 2006/0268594 | A1 | 11/2006 | Toda | |
| 2007/0132049 | A1 | 6/2007 | Stipe | |
| 2007/0285971 | A1 | 12/2007 | Toda et al. | |
| 2008/0079029 | A1 * | 4/2008 | Williams | 257/213 |
| 2008/0090337 | A1 | 4/2008 | Williams | |
| 2008/0310211 | A1 * | 12/2008 | Toda et al. | 365/148 |
| 2009/0163826 | A1 | 6/2009 | Mouttet | |
| 2009/0184305 | A1 | 7/2009 | Lee et al. | |
| 2009/0218565 | A1 | 9/2009 | Kawano et al. | |
| 2010/0008132 | A1 | 1/2010 | Hwang et al. | |
| 2010/0059796 | A1 | 3/2010 | Scheuerlein | |
| 2010/0109656 | A1 * | 5/2010 | Wang et al. | 324/210 |
| 2010/0155686 | A1 | 6/2010 | Bratkovski et al. | |
| 2010/0172170 | A1 * | 7/2010 | Tamai et al. | 365/148 |
| 2010/0264397 | A1 * | 10/2010 | Xia et al. | 257/4 |
| 2011/0017977 | A1 * | 1/2011 | Bratkovski et al. | 257/14 |
| 2011/0169052 | A1 * | 7/2011 | Bratkovski et al. | 257/192 |
| 2011/0182107 | A1 * | 7/2011 | Wu et al. | 365/148 |
| 2011/0188294 | A1 * | 8/2011 | Strachan et al. | 365/148 |
| 2011/0266513 | A1 * | 11/2011 | Williams et al. | 257/4 |
| 2011/0266605 | A1 * | 11/2011 | Strukov et al. | 257/314 |
| 2012/0014161 | A1 * | 1/2012 | Pickett et al. | 365/148 |
| 2012/0132880 | A1 * | 5/2012 | Bratkovski et al. | 257/3 |
| 2012/0233381 | A1 * | 9/2012 | Tucek et al. | 711/103 |
| 2012/0280224 | A1 * | 11/2012 | Doolittle et al. | 257/43 |

FOREIGN PATENT DOCUMENTS

| | | |
|---|---|---|
| WO | WO-2009075694 | 6/2009 |
| WO | WO-2010014064 A1 | 2/2010 |
| WO | WO-2010074685 A1 | 7/2010 |

OTHER PUBLICATIONS

International Search Report, Apr. 1, 2011, PCT Application No. PCT/US2010/047115, filed Aug. 30, 2010.

Extended European Search Report, Jan. 30, 2015, European Patent Application No. 10856793.4, 9 pages.

* cited by examiner

600

With addressing circuitry associated with a memory array, apply a voltage across a first memory element disposed between a first set of parallel lines and a second set of parallel lines, the second set of parallel lines intersecting the first set of parallel lines
(block 602)

↓

With the addressing circuitry associated with the memory array, apply a voltage across a second memory element disposed between the second set of parallel lines and a third set of parallel lines, the third set of parallel lines intersecting the second set of parallel lines
(block 604)

*Fig. 6*

MULTILAYER MEMORY ARRAY

STATEMENT OF GOVERNMENT INTEREST

This invention has been made with government support. The government has certain rights in the invention.

BACKGROUND

As the use of digital data increases, the demand for faster, smaller, and more efficient memory structures increases. One type of memory structure that has recently been developed is a crossbar memory array. A crossbar memory array includes a first set of conductive lines which intersect a second set of parallel conductive lines. Programmable memory elements configured to store digital data are placed at intersections between the first set of lines and second set of lines.

Creating higher density memory arrays has traditionally been accomplished by reducing the width of the conductive lines and the size of the memory elements. However, smaller line widths and smaller memory elements lead to more expensive and complicated manufacturing procedures.

One method of creating higher density memory arrays is to stack the crossbar arrays in a third dimension. However, stacking the crossbar arrays require more masks in the photolithographic processes typically used to manufacture the crossbar arrays. The more masks which are used, the more expensive it is to stack memory arrays in the third dimension.

BRIEF DESCRIPTION OF THE DRAWINGS

The accompanying drawings illustrate various embodiments of the principles described herein and are a part of the specification. The illustrated embodiments are merely examples and do not limit the scope of the claims.

FIG. 6 is a flowchart showing an illustrative method for accessing data within a multilayer memory array, according to one example of principles described herein.

Throughout the drawings, identical reference numbers designate similar, but not necessarily identical, elements.

DETAILED DESCRIPTION

As mentioned above, one method of creating higher density memory arrays is to stack the crossbar arrays in a third dimension. However, stacking the crossbar arrays requires more masks in the photolithographic processes typically used to manufacture the crossbar arrays. The more masks which are used, the more expensive it is to stack memory arrays in the third dimension.

In light of this and other issues, the present specification discloses a multilayer memory array that uses fewer masks during the photolithographic manufacturing process. According to certain illustrative examples, the memory elements from two adjacent layers within the multilayer memory array share the conductive lines between those two layers. Additionally, these memory elements are configured to operate like diodes in addition to storing data. A diode allows electric current in one direction while inhibiting the flow of electric current in the opposite direction. As will be described in more detail below, the diode-like properties of these memory elements allow a target memory element to be accessed without adverse effects from unselected memory elements both within the same layer and adjacent layers.

Through use of methods and systems embodying principles described herein, a multilayer memory array which requires fewer masks during the photolithographic manufacturing process is realized. Specifically, the multilayer memory array will only require N+1 masks as opposed to 2*N masks, where N is the number of layers. This allows for high density multilayer memory arrays to be produced at a lower cost.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

Throughout this specification and in the appended claims, the conductive lines forming a crossbar memory array are referred to as "row lines" and "column lines". These terms do not imply a specific orientation. Rather, they indicate an orientation relative to one another.

Figure 1:
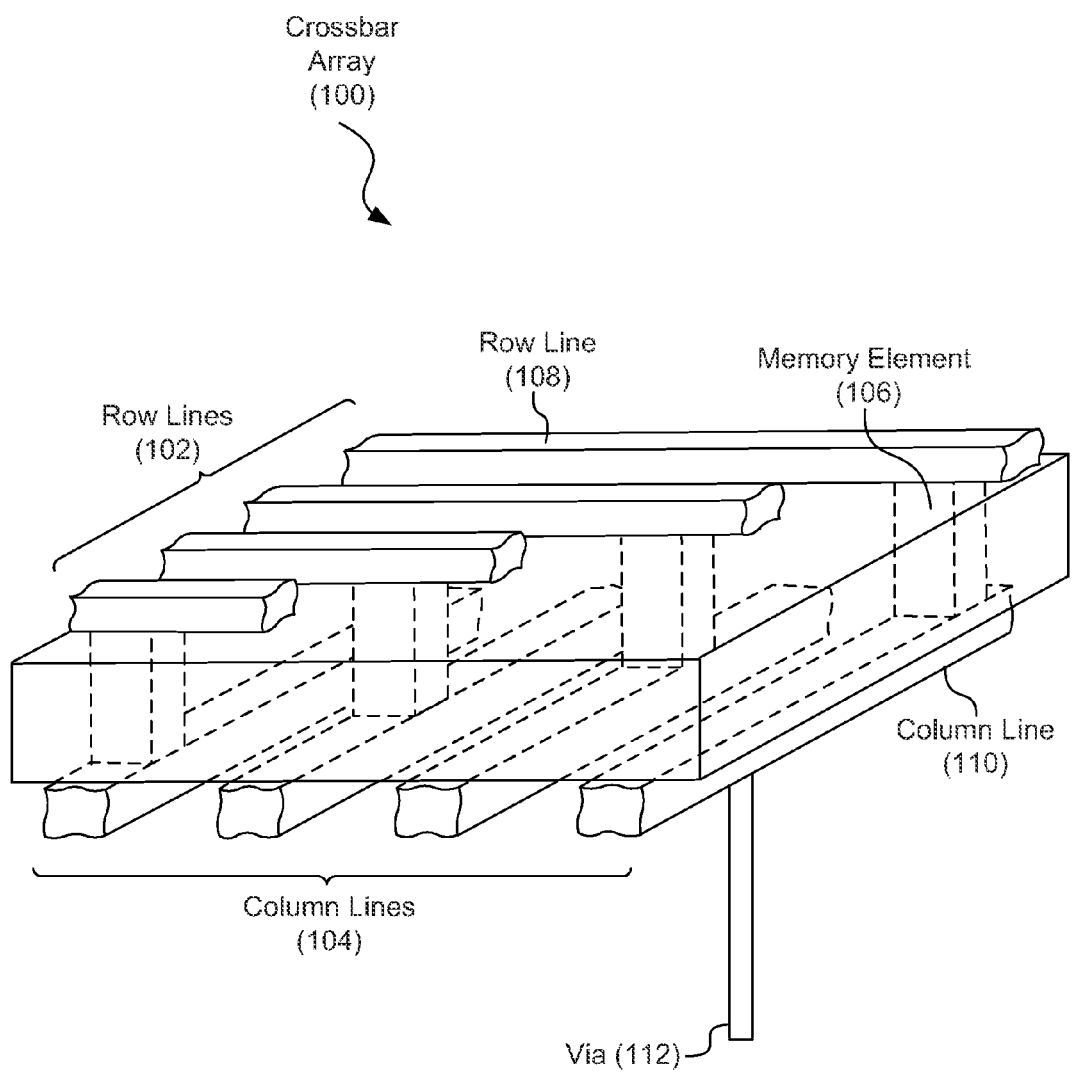
FIG. 1 is a diagram showing an illustrative crossbar array, according to one example of principles described herein.

Referring now to the figures, FIG. 1 is a diagram showing an illustrative crossbar memory array (100). According to certain illustrative examples, the crossbar array (100) includes a set of row lines (102) which are generally in parallel. Additionally, a set of column lines (104) is generally perpendicular to, and intersects, the row lines (102). Programmable memory elements (106) are disposed at the intersections between a row line (108) and a column line (110).

According to certain illustrative examples, the programmable memory elements (106) may be memristive devices. Memristive devices exhibit a "memory" of past electrical stimuli. For example, a memristive device may include a memristive matrix material that contains mobile dopants. These dopants can be moved within a matrix to dynamically alter the electrical operation of the memristive device.

The motion of dopants can be induced by the application of a programming condition such as an applied electrical voltage across a suitable matrix. The programming voltage generates a relatively high electric field through the memristive matrix and alters the distribution of dopants. After removal of the electric field, the location and characteristics of the dopants remain stable until the application of another programming electric field. For example, by changing the dopant configurations within a memristive matrix the electrical resistance of the device may be altered. The memristive device is read by applying a lower reading voltage which allows the internal electrical resistance of the memristive device to be sensed but does not generate a high enough electric field to cause significant dopant motion. Consequently, the state of the memristive device may remain stable over long time periods and through multiple read cycles.

According to certain illustrative examples, the crossbar array (100) may be used to form a non-volatile memory array. Each of the programmable memory elements (106) is used to represent one or more bits of data. Although individual row lines (108) and column lines (110) in FIG. 1 are shown with rectangular cross sections, crossbars may also have square, circular, elliptical, or more complex cross sections. The lines may also have many different widths, diameters, aspect ratios and/or eccentricities. The crossbars may be nanowires, sub-microscale wires, microscale wires, or wires with larger dimensions.

In some cases, the memory elements may be connected to the row lines (102) or column lines through vias between the electrodes of the memory elements. These vias may pass through an interlayer dielectric material positioned between the memory elements and the conductive lines. A dielectric material inhibits the flow of electric current.

According to certain illustrative examples, the crossbar architecture (100) may be integrated into a Complimentary Metal-Oxide-Semiconductor (CMOS) circuit or other conventional computer circuitry. Each individual bit lines may be connected to the CMOS circuitry by a via (112). The via (112) may be embodied as an electrically conductive path through the various substrate materials used in manufacturing the crossbar architecture. This CMOS circuitry can provide additional functionality to the memristive device such as input/output functions, buffering, logic, configuration, or other functionality. Multiple crossbar arrays can be formed over the CMOS circuitry to create a multilayer circuit.

The row lines (102) and column lines (104) may act as word lines and bit lines. A word line is used to access an entire word of bits and a bit line is used to access a specific bit within a word. A word is a set of bits which are grouped together for processing purposes. For example, processor architecture is typically designed to process words instead of individual bits.

As mentioned above, the memory elements within a crossbar array may be memristive memory elements. Memristive memory elements exhibit an inherent non-linear behavior. This non-linear behavior allows the memristive memory element to mimic diode behavior. To select a memory element within a crossbar array, the row line and column line connected to that memory element are selected. Lines are selected by applying a voltage to those lines. In a true crossbar array, no select devices or transistor prevent current from unintentionally going through alternate paths of low resistance. These alternate paths are referred to as sneak paths. The diode-like properties of memristive memory elements can prevent sneak paths in the memory array.

Figure 2A:
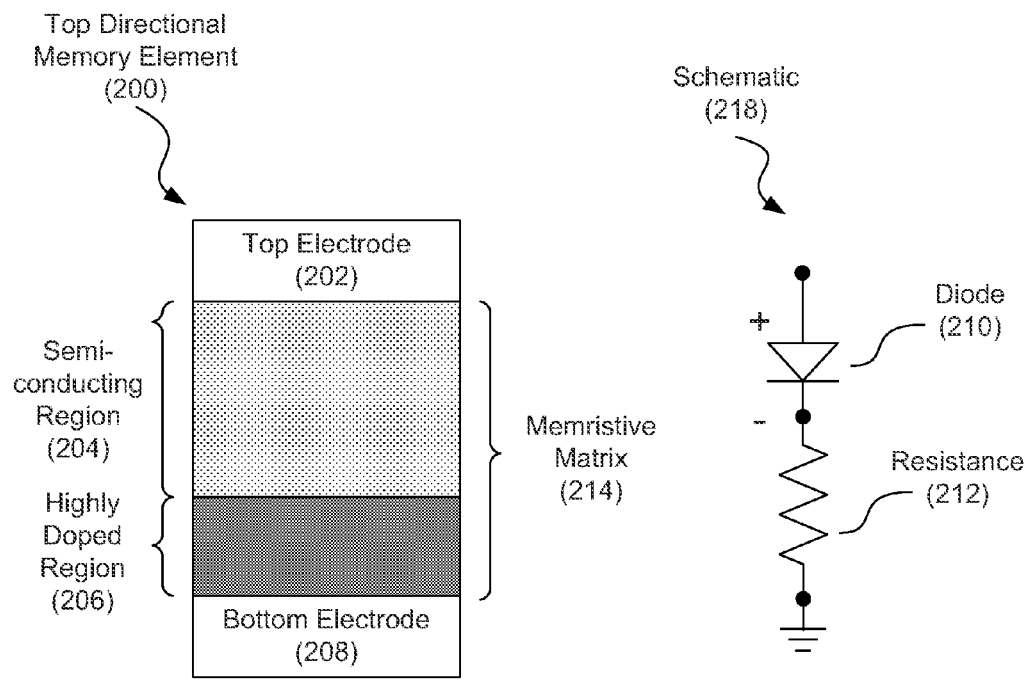
FIG. 2A is a diagram showing an illustrative bottom directional memory element and its accompanying circuit schematic, according to one example of principles described herein.
Figure 2B:
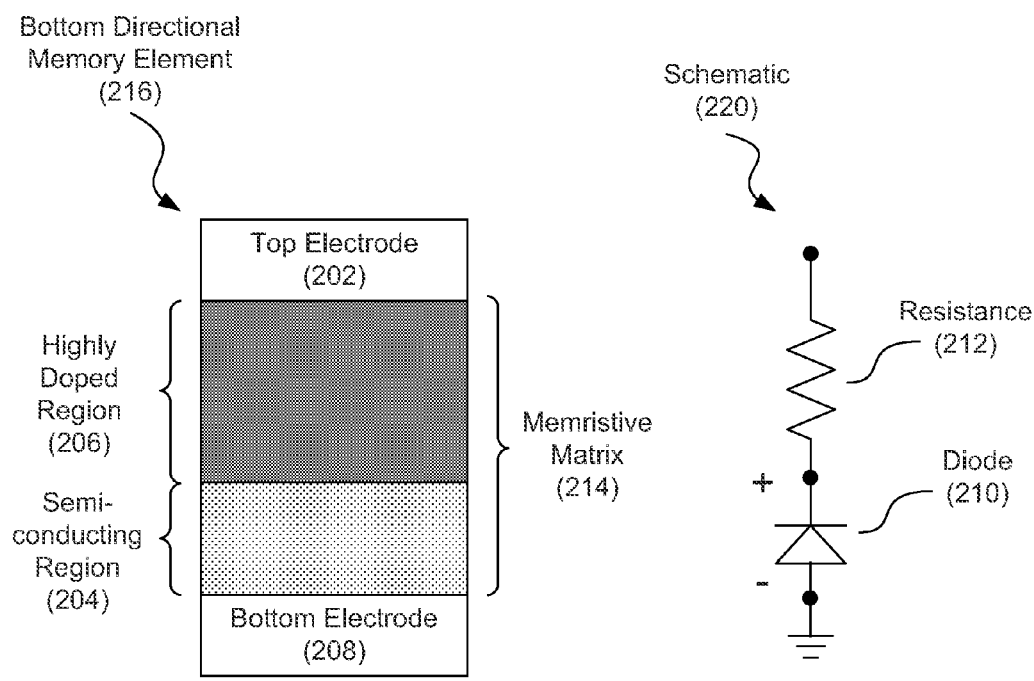
FIG. 2B is a diagram showing an illustrative top directional memory element and its accompanying circuit schematic, according to one example of principles described herein.

FIGS. 2A and 2B illustrate two possible configurations of a memory element (e.g. 106, FIG. 1). FIG. 2A is a diagram showing an illustrative top directional memory element (200) and its accompanying circuit schematic (218). A top directional memory element (200) is one that allows electric current to flow from the top electrode (202) to the bottom electrode (208) and inhibits electric current from flowing from the bottom electrode (208) to the top electrode (202). Throughout this specification and in the appended claims, the terms "top" and "bottom" do not indicate a specific position, but rather a position relative to one another.

According to one illustrative example, a top directional memory element (200) includes a top electrode (202) and a bottom electrode (208) in electrical and physical contact with a memristive matrix (214). The memristive matrix (214) includes two separate regions: a semiconducting region (204) which is not intentionally doped and a highly doped region (206).

The term "memristive matrix" describes a thin film of material that is electronically semiconducting or nominally electronically insulating and also a weakly ionic conductor. The memristive matrix (214) is capable of transporting and hosting ions that act as dopants to control the flow of electrons through the memristive memory element (200). The basic mode of operation is to apply an electric field, the drift field, which may exceed an effective threshold for enabling the motion of the ions in the memristive matrix (214) across the memristive device. The electric field is large enough to cause an ionic species to be transported within the memristive matrix (214) via ionic transport. The ionic species are specifically chosen from those that act as electrical dopants for the memristive matrix (214), and thereby change the electrical conductivity of the matrix from a high resistive state to a low resistive state. Furthermore, the memristive matrix (214) and the dopant species are chosen such that the drift of the dopants within the memristive matrix (214) is possible but not too facile. This ensures that the memristive device remains in whatever state it is set for a reasonably long time, perhaps many years at room temperature. Thus, the memristive memory element (200) is nonvolatile. A nonvolatile device is one which holds its state with or without receiving power.

The matrix material may be a thin film generally less than 200 nm thick), and is in many cases nanocrystalline or amorphous. The mobility of the dopant species in such nanostructured materials is much higher than in a bulk crystalline material, since diffusion can occur through grain boundaries, pores, or through local structural imperfections in an amorphous material. Also, because the film is so thin, the amount of time required to drift enough dopants into or out of a local region of the film to substantially change its conductivity is relatively rapid. Another advantage of nanometer scale memristive devices is that a large electric field can be produced by a relatively small applied voltage.

Conduction of electrons through the matrix material is frequently dominated by quantum mechanical tunneling of the electrons. When a semiconducting matrix material is essentially intrinsic for a discreet distance at a junction with an electrode, the tunneling barrier is high and wide, causing the memristive device to be in a high resistive state. When a significant number of dopant species have been injected into or distributed through a portion of the intrinsic semiconductor, the width and perhaps the height of the tunneling barrier are diminished by the potential of the charged species. This results in an increase of the conductivity of the element, placing the memristive memory element (200) in a low resistive state.

The semiconducting region (204) has very few dopants and prevents electrical current from flowing between the two electrodes (202, 208). The highly doped region (206) is conductive and serves as a source of dopants which can be moved into the semiconducting region (204) to change the overall electrical conductivity of the memristive matrix (214).

The memristive matrix materials may include various metal oxides such as titanium dioxides, vanadium oxides, tantalum oxides, nickel oxides, hafnium oxides, zirconium oxides, copper oxides and iron oxides. The memristive matrix materials may also include tertiary oxides such as Strontium Titanium Trioxide (SrTiO3). The electrodes (202, 208) may be constructed from a variety of conducting materials, including but not limited to: metals, metallic alloys, metallic composite materials, nanostructured metallic materials, heavily doped semiconductors, or other suitable conducting materials. The electrodes may be non-reducing conductive materials so as to not interfere with the oxides of the memristive matrix (214) materials.

A programming voltage can be applied to change the state of the memristive memory element (200). The programming voltage results in an electric field which facilitates not only the movement of dopants from the highly doped region (206) into the intrinsic semiconducting region (204) but also the creation of some native dopants, such as oxygen vacancies, via an electro-reduction process in oxide memristive materials.

The polarity and voltage difference which is applied across the memristive matrix (214) varies according to a variety of factors including, but not limited to: material properties, geometry, dopant species, temperature, and other factors. For example, when the ions are positively charged, the ions are repelled by positive voltage potentials and attracted to negative voltage potentials.

According to one illustrative example, a positive voltage difference is applied between the top electrode (202) and the bottom electrode (208). This pushes the interface between the semiconducting region (204) and the highly doped region (206) towards the bottom electrode (208). This is because the positively charged dopants will diffuse farther into the highly doped region (206) from the semiconducting region (204), increasing the width of the tunnel barrier. This makes the top directional memory element (200) more resistive and reduces the flow of electric current. Additionally, the junction between the semiconducting region (204) and the top electrode (202) acts as a diode (210). The equivalent circuit schematic (218) shows a diode (210) in series with a resistance (212).

When a negative voltage difference is applied from the top electrode (202) to the bottom electrode (208), the oxygen vacancy dopants move further into the semiconducting region and away from the bottom electrode (208). This decreases the intrinsic layer thickness and thus the tunnel barrier width. This decreases the resistance of the top directional memory element (200) and increases the flow of electric current.

FIG. 2B is a diagram showing an illustrative bottom directional memory element (216) and its accompanying circuit schematic. The bottom directional memory element (216) is similar to the top directional memory element (200). The difference is that the positions of the highly doped region (206) and the semi-conducting region (214) are reversed.

In FIG. 2B, when a negative voltage is applied to the top electrode relative to the bottom electrode (208), the interface between the semiconducting region (204) and the highly doped region (206) moves towards the top electrode (202). This causes the memory element (216) to be more resistive and inhibits the flow of electric current.

When a positive voltage is applied on the top electrode (202) relative to the bottom electrode (208), then the bottom directional memory element (216) becomes less resistive. This allows the flow of electric current through the memory element (216). Additionally, the junction between the semiconducting region (204) and the bottom electrode (208) behaves like a diode (210). The diode is shown in the circuit schematic (220).

Figure 3A:
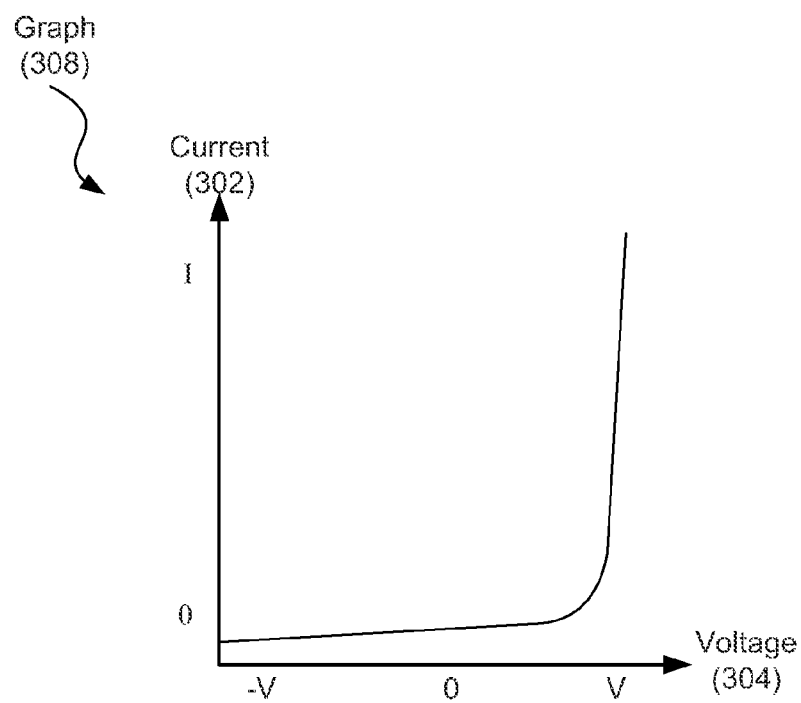
FIG. 3A is a diagram showing an illustrative current to voltage relationship for the bottom directional device of FIG. 2A, according to one example of principles described herein.

FIG. 3A is a diagram showing an illustrative current to voltage relationship for the top directional memory element of FIG. 2A. As can be seen from the graph (300), with a positive voltage of V applied between the top electrode to the bottom electrode, a positive electric current of I will flow through the memory element. As a matter of convention, a positive electric current indicates that electric current is flowing from the top electrode (e.g. 202, FIG. 2) to the bottom electrode (e.g. 208, FIG. 2). With a voltage of zero or less applied across the bottom directional memory element, a negligible amount of current will flow through the memory element.

Figure 3B:
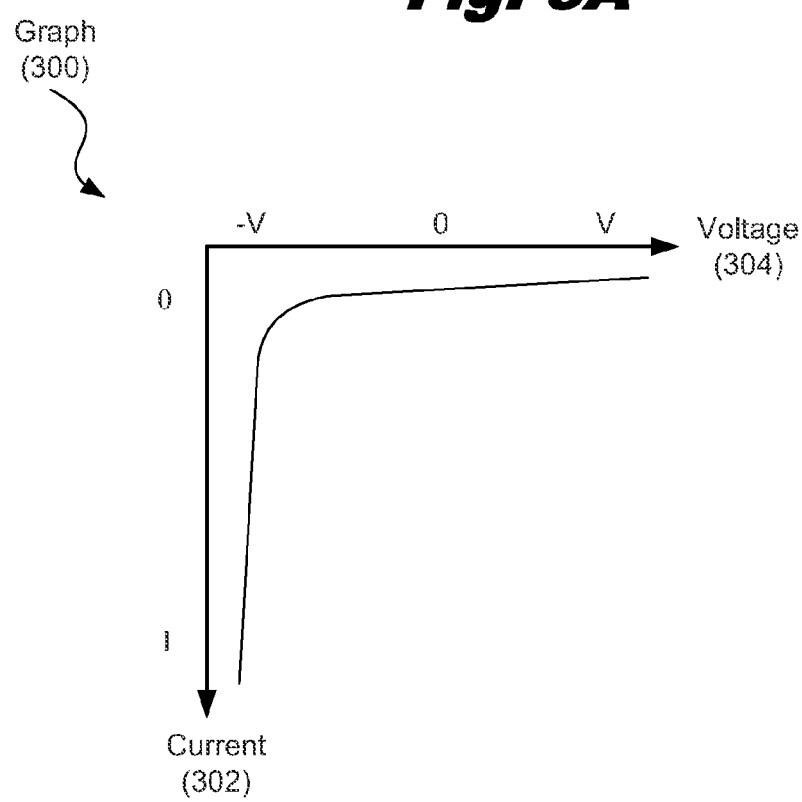
FIG. 3B is a diagram showing an illustrative current to voltage relationship for the top directional memory element of FIG. 2B, according to one example of principles described herein.

FIG. 3B is a diagram showing an illustrative current to voltage relationship for the bottom directional memory element of FIG. 2B. The horizontal axis represents voltage (304) and the vertical axis represents electric current (302). As can be seen from the graph (308), with a negative voltage of −V applied between the top electrode and the bottom electrode, a negative electric current of −I flows through the memory element. As a matter of convention, a negative electric current indicates that electric current is flowing from the bottom electrode to the top electrode of the memory element. With a voltage of zero or more, a negligible amount of electric current is flowing through the memory element.

Figure 4:
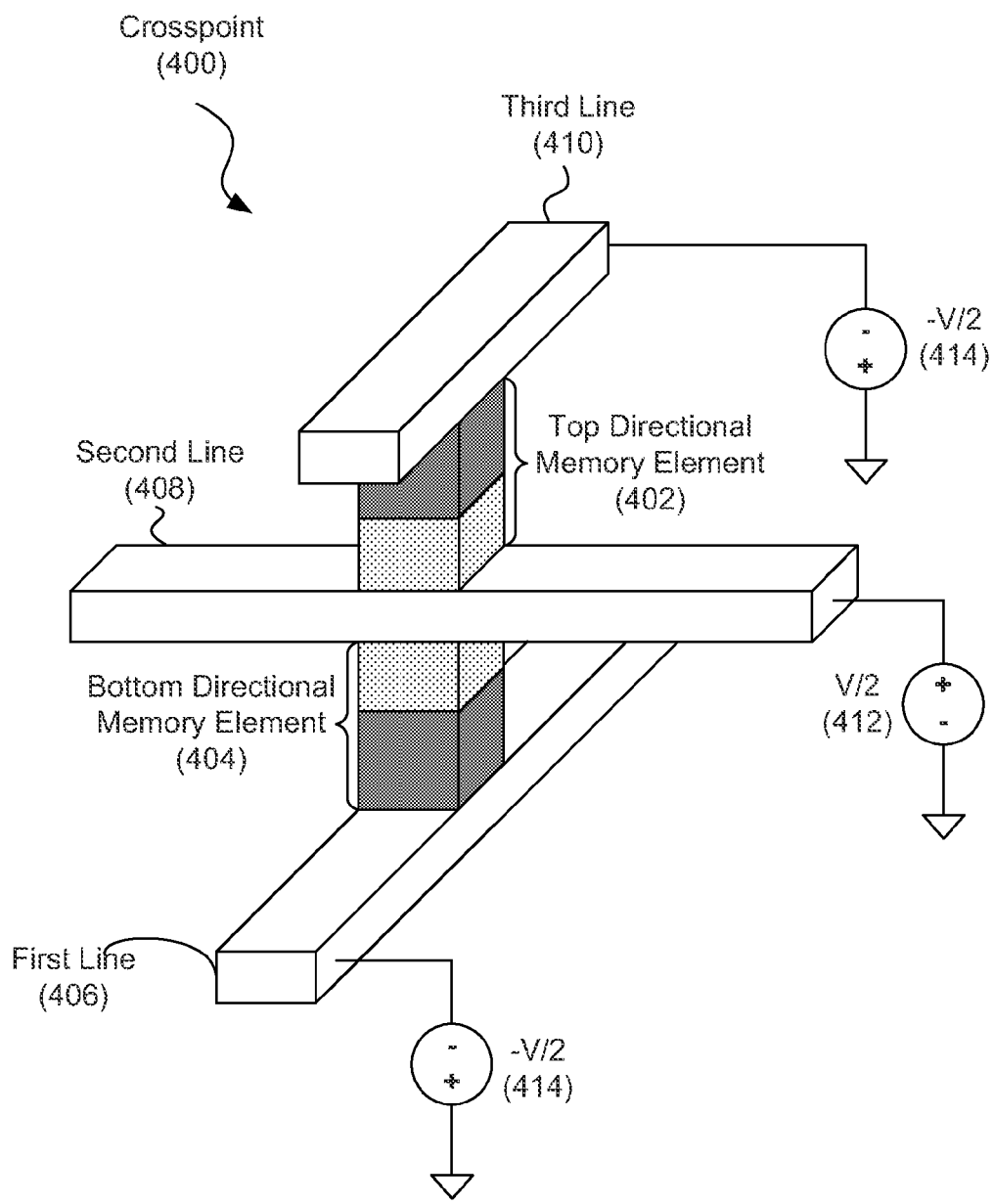
FIG. 4 is a diagram showing an illustrative perspective view of a crosspoint within a multilayer memory array, according to one example of principles described herein.

FIG. 4 is a diagram showing an illustrative perspective view of a crosspoint (400) within a multilayer memory array. According to certain illustrative examples, a bottom directional memory element (404) is placed between a first line (406) and a second line (408) relatively perpendicular to the first line (406). Additionally, a top directional memory element (402) is placed between a second line and a third line generally perpendicular to the second line (408).

Specifically, the bottom electrode of the bottom directional memory element is in electrical contact with the first line (406). Additionally, both the top electrode of the bottom directional memory (404) element and the bottom electrode of the top directional memory element (402) are in electrical contact with the second line (408). Furthermore, the top electrode of the top directional memory element (402) is in electrical contact with the third line (410).

The first line (406), second line (408), and third line (410) each represent one of a set of parallel lines. In one example, the first line (406) and third lines may correspond to bit lines and the second line (408) may correspond to a word line.

According to one example, to access a particular memory element within an array, a voltage is applied across the particular memory element. The memory element to be accessed will be referred to as the target memory element. To apply a voltage across a target memory element, a voltage is switched onto a line connected to the top electrode of the target memory element and a line connected to the bottom electrode of the target memory element.

The magnitude of the voltage level applied across a target memory element to access the target memory element is dependent upon whether it is desired to read the state of the target memory element or write the state of the target memory element. To read the state of a target memory element, a generally lower voltage is applied so as not to change the state of the target memory element. To write the state of the target memory element, a higher voltage is applied to change the position of the interface between the highly doped region (e.g. 206, FIG. 2) and the semiconducting region (e.g. 204, FIG. 2) as described above.

According to one illustrative example, to access the bottom directional memory element (404), a voltage V is applied across the memory element (404). To cause a positive voltage of V to be applied across the memory element (404), a voltage of V/2 (412) is applied to the second line (408) that is connected to the top electrode of the bottom directional memory element (404). Additionally, a voltage of −V/2 (414) is applied to the first line (406) that is connected to the bottom electrode of the bottom directional memory element (404). This will cause a voltage drop of V across the bottom directional memory element (404). The top directional memory element (402) only sees a voltage of −V/2 if the third line (410) has no voltage applied. The diode-like properties of the top directional memory element (402) prevent current from forming sneak paths through this layer of the multilayer array.

To access the top directional memory element (402), a voltage −V is applied across the memory element (404). To cause the voltage −V to be applied across the memory element (404), a voltage of −V/2 (414) is applied to the third line (410) that is connected to the top electrode of the top directional memory element (402). Additionally, a voltage of V/2 (412) is applied to the second line (408) that is connected to the bottom electrode of the top directional memory element. This will cause a voltage drop of −V between the top electrode and the bottom electrode of the top directional memory element (404).

According to certain illustrative examples, multiple memory elements can be written to simultaneously. This can be done by applying V/2 to one line and applying −V/2 to a number of memory elements along that line. For example, the second line (408) may act as a word line. A voltage of V/2 is applied to the second line (408). A voltage of −V/2 is applied to lines running parallel to the first line (406). Each bottom directional memory element (404) connected between the second line (408) and a first line (406) having −V/2 applied will be affected. This process is referred to as a parallel write.

Figure 5:
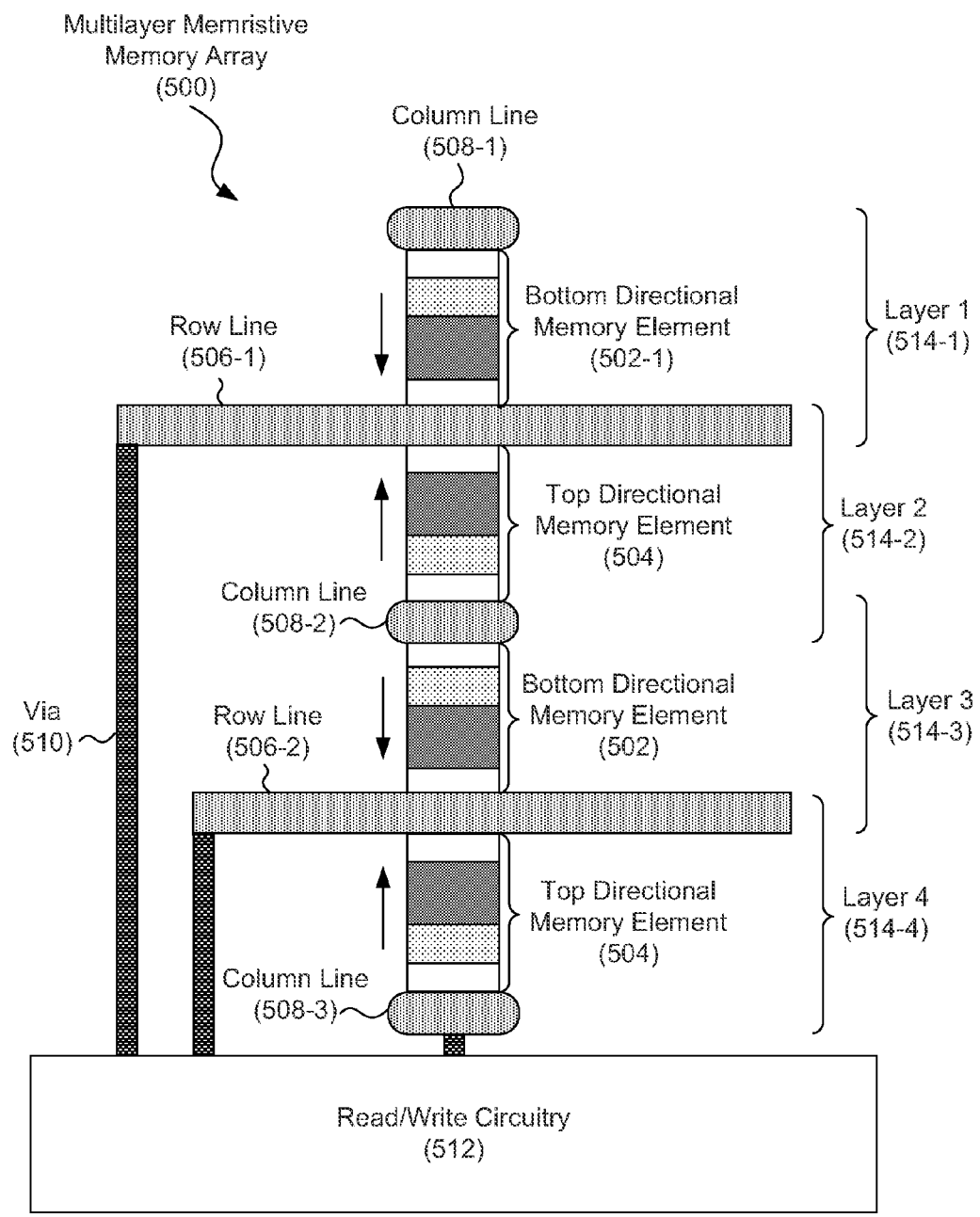
FIG. 5 is a diagram showing an illustrative side view of a crosspoint within a multilayer memory array, according to one example of principles described herein.

FIG. 5 is a diagram showing an illustrative side view of one crosspoint within a multilayer memory array (500). According to certain illustrative examples, multiple layers may be stacked on top of each other, Each layer (514) will share a layer of row lines (506) and/or column lines (508) with adjacent layers (514). Row lines (506) refer to conductive wire lines which run in one direction and column lines (508) refer to conductive wire lines that run in a direction generally perpendicular to the row lines. Both row lines (506) and column lines (508) may be connected to addressing circuitry (512) through vies (510).

Layer 1 (514-1) includes a set of bottom directional memory elements (502). Thus, at each crosspoint, a bottom directional memory element (502) is placed between a column line (508-1) and a row line (506-1). Electric current is then able to flow across the bottom directional memory elements (502) from the top electrode connected to a column line (508-1) and the bottom electrode connected to the row-line (506-1). At the normal operating voltage levels which are applied to the row lines (506) and column lines (508), electric current is inhibited from flowing from the bottom electrode to the top electrode. This prevents various voltages and currents from layer 2 (514-2) from interfering with the memory elements (502) of layer 1 (514-1).

Layer 2 includes a set of top directional memory elements (504). Thus, electric current is allowed to flow from the bottom electrodes connected to a column line (508-2) and the top electrodes connected to the row line (506-1). At the normal operating voltage levels which are applied to the row lines (506) and column lines (508), electric current is inhibited from flowing between the row lines (506-1) and the column lines (508-2) associated with layer 2 (514-2). This prevents various voltages and currents from layer 1 (514-1) from interfering with the memory elements (504) of layer 2 (514-2).

Layer 3 (514-3) and layer 4 (514-4) continue the pattern exhibited between layer 1 (514-1) and layer 2 (514-2). Layer 3 (514-3) includes a set of bottom directional memory elements (502) connected between a column line (508-2) and a row line (506-2). Layer 4 (514-4) includes a set of top directional memory elements (504) connected between a row line (506-2) and a column line (508-3).

By sharing the same conductors between adjacent layers within the multilayer memory array, a reduced set of masks are used in the manufacturing process. Thus the manufacturing is less costly and a higher density memory array is produced. By alternating between top directional memory elements (504) and bottom directional memory elements every successive layer, the read/write operations used on one layer will not adversely affect adjacent layers.

FIG. 6 is a flowchart showing an illustrative method (500) for operating a multilayer memory array. According to certain illustrative examples, the method includes, with addressing circuitry associated with a memory array, applying (block 602) a voltage across a first memory element disposed between a first set of parallel lines and a second set of parallel lines, the second set of parallel lines intersecting the first set of parallel lines; and, with the addressing circuitry associated with the memory array, applying (block 604) a voltage across a second memory element disposed between the second set of parallel lines and a third set of parallel lines, the third set of parallel lines intersecting the second set of parallel lines.

In sum, through use of methods and systems embodying principles described herein, a multilayer memory array which has shared sets of conductive lines between adjacent layers is realized. The alternating between top directional memory elements and bottom directional memory elements every successive layer ensures that the read/write operations used on one layer will not adversely affect adjacent layers. The reduced set of conductive wire lines used by the multilayer memory array reduces the manufacturing costs and produces a higher density memory array.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:
1. A multilayer memory array comprising:
   a number of layers, each layer comprising:
      a top set of parallel lines;
      a bottom set of parallel lines intersecting said top set of parallel lines; and
      memory elements disposed at intersections between said top set of parallel lines and said bottom set of parallel lines, each memory element comprising:
         a memristive matrix comprising a doped region and a semiconducting region where dopants are mobile to migrate from said doped region into said semiconducting region to change a resistance of said memristive matrix, said memristive matrix allowing current flow in a first direction and inhibiting current flow in a second, opposite direction;
         a number of top electrodes positioned between the memristive matrixes and the top set of parallel lines; and
         a number of bottom electrodes positioned between the memristive matrixes and the bottom set of parallel lines,
      wherein the top set of parallel lines from one of said layers is also the bottom set of parallel lines for an adjacent one of said layers, and wherein the top electrodes and bottom electrodes are made of a non-reducing conductive material to not interfere with oxides within the memristive matrix.

2. The memory array of claim 1, in which, in a memory element of a first layer of said number of layers, the doped region is on top of the semiconducting region, and, in a memory element of a second layer, immediately adjacent said first layer, the semiconducting region is on top of the doped region.

3. The memory array of claim 1, in which said memristive memory elements comprise metal oxide materials.

4. The memory array of claim 1, in which each of said memory elements from one of said layers inhibits electric current from flowing in one direction and each of said memory elements in an adjacent one of said layers inhibits electric current from flowing in an opposite direction as said one direction.

5. The memory array of claim 1, in which to access a memory element of one of said layers, a voltage is applied to a first line from said top set of parallel lines and a second line from said bottom set of parallel lines, said top line and said bottom line connected to said memory element.

6. The memory array of claim 1, in which a polarity of a voltage applied to a memory element from one of said layers is reversed when applying said voltage to a memory element within an adjacent one of said layers.

7. The memory array of claim 1, in which multiple memory elements along a same line are accessed simultaneously.

8. A memory system comprising:
addressing circuitry; and
a multilayer crossbar memory array comprising:
a first set of parallel lines intersecting a second set of parallel lines, a first set of memory elements being disposed at intersections between said first set of parallel lines and said second set of parallel lines;
a third set of parallel lines intersecting said second set of parallel lines, a second set of memory elements being disposed at intersections between said second set of parallel lines and said third set of parallel lines,
wherein said first set of memory elements inhibit current flow in a first direction and said second set of memory elements inhibit current flow in a second direction opposing said first direction,
wherein each memory element comprises:
a memristive matrix comprising a doped region and a semiconducting region where dopants are mobile to migrate from said doped region into said semiconducting region to change a resistance of said memristive matrix;
a number of top electrodes positioned between the memristive matrixes and the top set of parallel lines; and
a number of bottom electrodes positioned between the memristive matrixes and the bottom set of parallel lines,
wherein the top electrodes and bottom electrodes are made of a non-reducing conductive material to not interfere with oxides within the memristive matrix.

9. The system of claim 8, in which said memory elements are memristive memory elements.

10. The system of claim 9, in which said memristive memory elements comprise metal oxide materials.

11. The system of claim 8, in which to access said first set of memory elements, a first voltage is selectively applied to said first set of parallel lines and said second set of parallel lines.

12. A method for accessing data within a multilayer memory array, the method comprising:
with addressing circuitry associated with said memory array, applying a voltage across a first memory element disposed between a first set of parallel lines and a second set of parallel lines, said second set of parallel lines intersecting said first set of parallel lines; and
with said addressing circuitry, applying a voltage across a second memory element disposed between said second set of parallel lines and a third set of parallel lines, said third set of parallel lines intersecting said second set of parallel lines;
wherein said first memory element inhibits current flow in a first direction and said second memory element inhibits current flow in a second direction opposing said first direction;
wherein each memory element comprises:
a memristive matrix comprising a doped region and a semiconducting region where dopants are mobile to migrate from said doped region into said semiconducting region to change a resistance of said memristive matrix;
a number of top electrodes positioned between the memristive matrixes and the top set of parallel lines; and
a number of bottom electrodes positioned between the memristive matrixes and the bottom set of parallel lines,
wherein the top electrodes and bottom electrodes are made of a non-reducing conductive material to not interfere with oxides within the memristive matrix.

13. The method of claim 12, in which said applying a voltage across the first memory element disposed between the first set of parallel lines and the second set of parallel lines further comprising applying half of said voltage to one of the second set of parallel lines and applying a negative half of said voltage to one of the first set of parallel lines.

14. The method of claim 13, in which said applying a voltage across the second memory element disposed between the second set of parallel lines and the third set of parallel lines further comprising again applying half of said voltage to one of the second set of parallel lines and applying a negative half of said voltage to one of the third set of parallel lines.

15. The method of claim 13, further comprising simultaneously applying the voltage to multiple memory elements.

16. The method of claim 12, further comprising forming said multilayer memory array using photolithographic masks, where a number of said masks used is N+1, where N is a number of layers in said multilayer memory array.

* * * * *